(12) United States Patent
Lee et al.

(10) Patent No.: US 9,660,369 B2
(45) Date of Patent: May 23, 2017

(54) ASSEMBLY OF CABLE AND CONNECTOR

(71) Applicant: BELLWETHER ELECTRONIC CORP, Taoyuan (TW)

(72) Inventors: Hsing-Yu Lee, Taoyuan (TW); Han-Min Lee, Taipei (TW)

(73) Assignee: BELLWETHER ELECTRONIC CORP, Taoyuan (TW)

( * ) Notice: Subject to any disclaimer, the term of this patent is extended or adjusted under 35 U.S.C. 154(b) by 0 days.

(21) Appl. No.: 15/150,673

(22) Filed: May 10, 2016

(65) Prior Publication Data
US 2017/0005424 A1 Jan. 5, 2017

(30) Foreign Application Priority Data

Jul. 1, 2015 (TW) .............................. 104121349 A

(51) Int. Cl.
*H01R 12/79* (2011.01)
*H01R 12/77* (2011.01)

(52) U.S. Cl.
CPC .......... *H01R 12/778* (2013.01); *H01R 12/775* (2013.01)

(58) Field of Classification Search
CPC .. H01R 13/6658; H01R 12/79; H01R 12/592; H01R 12/62; H01R 13/658; H01R 23/025; H01R 23/662
USPC ................................ 439/76.1, 492, 497, 493
See application file for complete search history.

(56) References Cited

U.S. PATENT DOCUMENTS

| | | | | |
|---|---|---|---|---|
| 3,951,492 A | * | 4/1976 | Braund ................... | H01R 31/00 439/494 |
| 4,900,266 A | * | 2/1990 | Sainsbury ............ | H01R 23/661 439/451 |
| 5,387,113 A | * | 2/1995 | Dickerson ............ | H01B 7/0861 174/36 |
| 5,955,703 A | * | 9/1999 | Daly ................... | H01R 13/6658 174/117 R |
| 6,190,196 B1 | * | 2/2001 | Kato .................... | H01R 12/772 439/493 |
| 6,210,178 B1 | * | 4/2001 | DeForest, Jr. ....... | H01R 12/721 439/76.1 |
| 6,276,943 B1 | * | 8/2001 | Boutros ........... | H01R 13/65802 439/676 |
| 6,685,509 B1 | * | 2/2004 | Yeh ..................... | H01R 23/6873 439/108 |

(Continued)

*Primary Examiner* — Gary Paumen
(74) *Attorney, Agent, or Firm* — Li & Cai Intellectual Property (USA) Office

(57) ABSTRACT

An assembly of cable and connector includes a flat flexible cable, an input-output connector and a paddle card. The flat flexible cable has parallel conductor wires, an insulated layer wrapped around the conductor wires. The conductor wires have at least one first integrated power wire and signal wires. A width of the first integrated power wire is larger than two times the width of one signal wire. The input-output connector has terminals separated into an upper-side terminal and a lower-side terminal. A number of the terminals is larger than a number of the conductor wires. The paddle card has a base board, and transferring circuits distributed on the base board. The transferring circuits has first pads on one side of the base board which are correspondingly connected to the conductor wires, and second pads on the other side of the base board which are correspondingly connected to the terminals.

13 Claims, 10 Drawing Sheets

(56) References Cited

U.S. PATENT DOCUMENTS

| | | | | |
|---|---|---|---|---|
| 6,705,893 B1* | 3/2004 | Ko | H01R 12/714 | 439/497 |
| 7,651,379 B1* | 1/2010 | Wu | H01R 12/62 | 439/108 |
| 8,152,568 B2* | 4/2012 | Wu | H01R 13/6658 | 439/353 |
| 8,512,071 B2* | 8/2013 | Tseng | H01R 12/62 | 439/493 |
| 8,672,689 B2* | 3/2014 | Tseng | H01R 12/62 | 439/493 |
| 8,740,631 B2* | 6/2014 | Chen | H01R 12/62 | 439/76.1 |
| 8,758,030 B2* | 6/2014 | Chen | H01R 12/77 | 439/493 |
| 8,851,905 B2* | 10/2014 | Soubh | H01R 13/6658 | 439/499 |
| 9,355,756 B2* | 5/2016 | Gundel | H01B 11/203 | |
| 2002/0009906 A1* | 1/2002 | Akama | H01R 12/62 | 439/76.1 |
| 2003/0054682 A1* | 3/2003 | Sugata | B60R 16/027 | 439/164 |
| 2003/0119343 A1* | 6/2003 | Lin | H01R 9/0515 | 439/76.1 |
| 2006/0228935 A1* | 10/2006 | Wen | H01R 12/62 | 439/497 |
| 2009/0197459 A1* | 8/2009 | Yu | H01R 4/027 | 439/497 |
| 2009/0215290 A1* | 8/2009 | Zhu | H01R 13/621 | 439/76.1 |
| 2009/0264011 A1* | 10/2009 | Wang | H01R 13/6658 | 439/507 |
| 2009/0298327 A1* | 12/2009 | Wang | H01R 12/62 | 439/507 |
| 2009/0298328 A1* | 12/2009 | Wang | H01R 23/661 | 439/507 |
| 2010/0062636 A1* | 3/2010 | Wang | H01R 12/62 | 439/493 |
| 2013/0109244 A1* | 5/2013 | Chen | H01R 12/62 | 439/682 |
| 2013/0109245 A1* | 5/2013 | Tseng | H01R 12/62 | 439/682 |
| 2013/0217261 A1* | 8/2013 | Chen | H01R 12/79 | 439/499 |
| 2013/0337694 A1* | 12/2013 | Chen | H01R 12/721 | 439/637 |
| 2014/0004736 A1* | 1/2014 | Chen | H01R 12/77 | 439/493 |
| 2014/0113484 A1* | 4/2014 | Chen | H01R 12/79 | 439/492 |
| 2015/0270660 A1* | 9/2015 | Chen | H01R 24/62 | 439/676 |
| 2015/0295373 A1* | 10/2015 | Chen | H01R 31/06 | 439/631 |

* cited by examiner

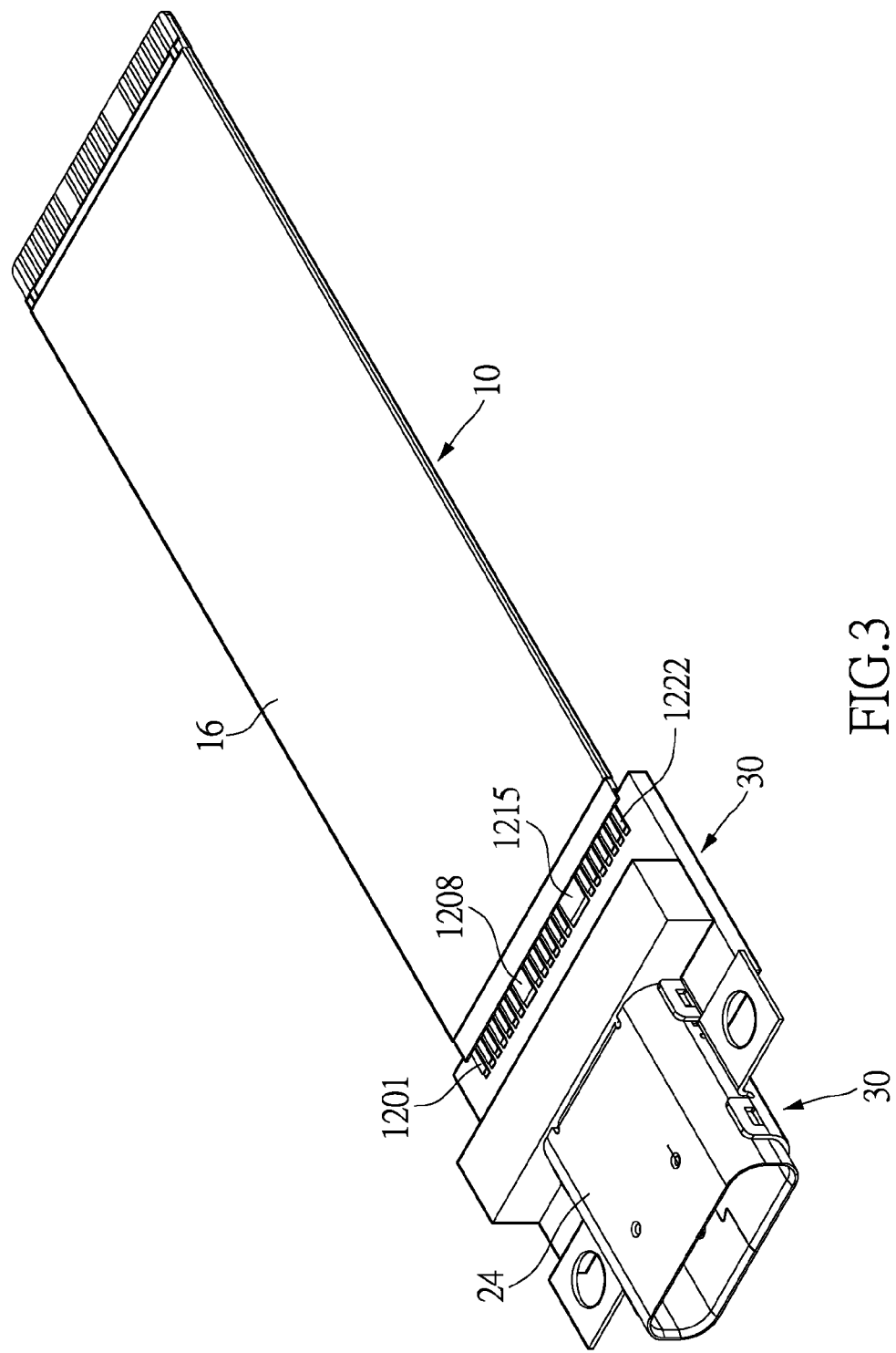

ASSEMBLY OF CABLE AND CONNECTOR

BACKGROUND OF THE INVENTION

1. Field of the Invention

The present disclosure is related to an assembly of cable and connector. In particular, the present disclosure relates to a flat flexible cable adapting to an input-output connector, which can simultaneously transmit electric current and high frequency signals.

2. Description of Related Art

Not only are communication requirements more and more demanding, but the speed requirement for signal transmitting of electronic devices is higher and higher. Thus, the manufacture of the cable used to transmit signals is more and more difficult. For rapidly transmitting a significant amount of signal, an optional choice is to use optical fiber cable. However, the optical fiber cable is usually only used to transmit high-frequency signals, and the cost of optical fiber cable is high. If it also needs to transmit electrical power, one additional power cable is required to be combined with the optical fiber cable, which becomes more complex.

In addition, to match with the higher and higher electrical current requirement of electronic devices, the current transmitting specification of electrical connectors is more and more strict. For example, the USB Type-C connector, has different standards of electrical current according to various cable assembly applications. Concerning power transmitting specifications, some requirements of cable and connector are even up to 5 amperes, and the highest rate of signal transmitting is even required to be up to 10 G bit each second. There are some available USB Type-C cables correspondingly designed for outside of the electronic devices. In addition, the electronic products are slimmer and lighter, such as cellphones, but some conditions cannot be solved by using a layout and routing on a circuit board to achieve input/output and inner signal transmitting. Therefore, it is desirable to propose a novel assembly of cable and connector to use an adapting device with lower cost, to reach the requirements of high-frequency and high current transmitting, so as to overcome the above-mentioned problems.

SUMMARY OF THE INVENTION

It is one objective of this present disclosure to provide an assembly of cable and connector, which is able to achieve the requirements of high-frequency and high current transmitting by flat flexible cable, with a lower manufacturing cost.

In addition, it is one more objective of the present disclosure, to provide an assembly of cable and connector, to fulfill the requirement of high current transmitting by a less amount of power conductor wire, and the total width of the flat flexible cable is reduced.

In order to achieve the above objectives, according to one exemplary embodiment of the instant disclosure, an assembly of cable and connector is provided, which includes a flat flexible cable, an input-output connector, and a paddle card. The flat flexible cable has a plurality of parallel-arranged conductor wires, and an insulated layer wrapped around the conductor wires. The conductor wires have at least one first integrated power wire and a plurality of signal wires. A width of each of the at least one first integrated power wire is larger than two times the width of the signal wire. The input-output connector has a plurality of terminals. The terminals include a plurality of upper-side terminals and a plurality of lower-side terminals. A number of the terminals is more than a number of the conductor wires. The paddle card has a base board, a plurality of transferring circuits distributed on the base board, and a plurality of second pads. The transferring circuits include a plurality of first pads distributed on one side of the base board. The second pads are distributed on another side of the base board. The first pads are connected to the conductor wires of the flat flexible cable correspondingly. The second pads are connected to the terminals of the input-output connector correspondingly.

Thus, the instant disclosure has advantages as follows. The present disclosure can achieve the transmitting requirements of high-frequency and high-current by a flat flexible cable, and fulfill the transmitting function of high-frequency and high-current with a lower manufacturing cost. In addition, the number of the power conductor wire is less, yet it can achieve the transmitting requirements of high current and reduce the total width of the flat flexible cable.

For further understanding of the instant disclosure, reference is made to the following detailed description illustrating the embodiments and examples of the instant disclosure. The description is for illustrative purpose only and is not intended to limit the scope of the claim.

BRIEF DESCRIPTION OF THE DRAWINGS

FIG. 3 is an assembled perspective view of the assembly of cable and connector of the present disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
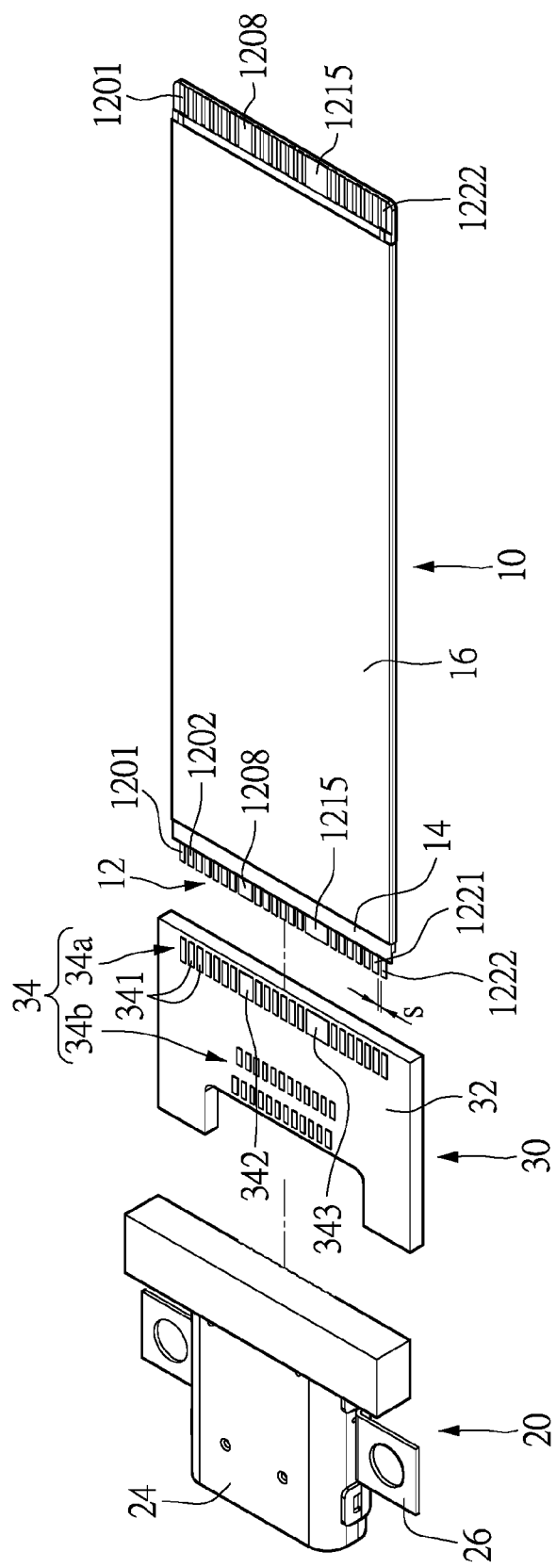
FIG. 1 is an exploded perspective view of an assembly of cable and connector of the present disclosure.
Figure 2:
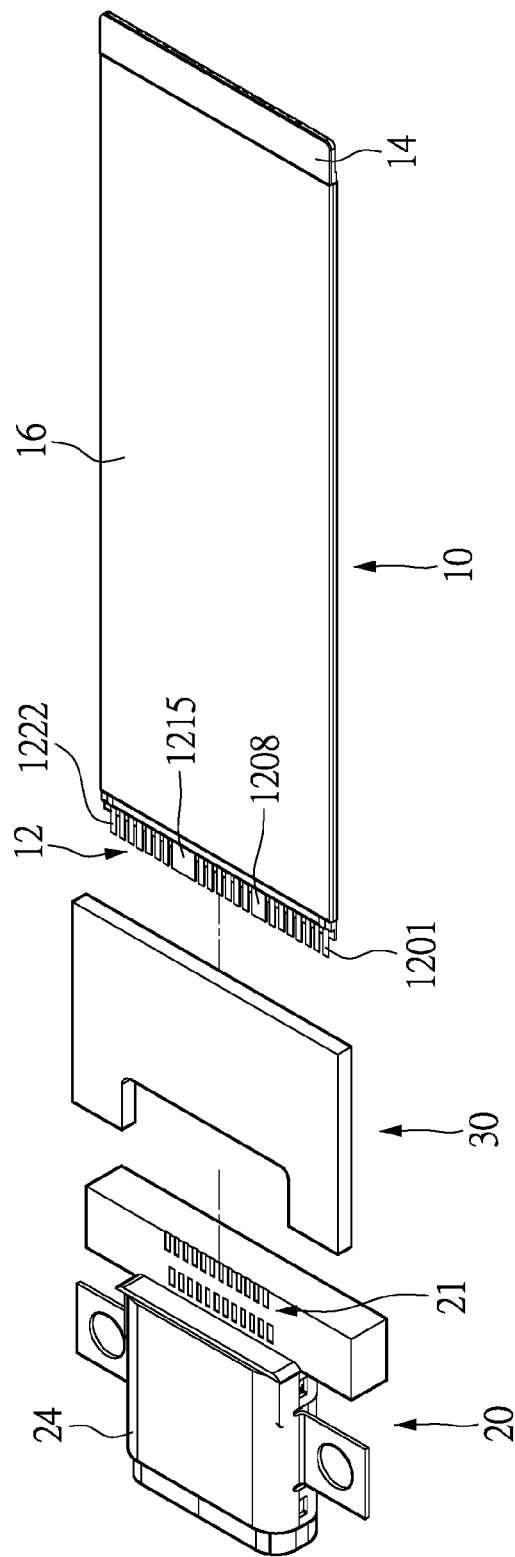
FIG. 2 is another exploded perspective view of the assembly of cable and connector of the present disclosure.

Please refer to FIGS. 1 and 2, which are different exploded perspective views of an assembly of cable and connector of the present disclosure. The present disclosure provides an assembly of cable and connector, which includes a flat flexible cable 10, an input-output connector 20, and a paddle card 30.

A flat flexible cable (FFC) 10 has a plurality of parallel-arranged conductor wires 12, and an insulated layer 14 wrapped around the conductor wires 12. The flat flexible cable, or FFC, refers to any variety of electrical cable that is both flat and flexible, with advantages of thin thickness, small volume, easy connection, detaching easily, good anti-electromagnetic interference (anti-EMI) . . . etc. In additional, the price and cost of flat flexible cable is better than that of the FPC, and optical cable.

Figure 1A:
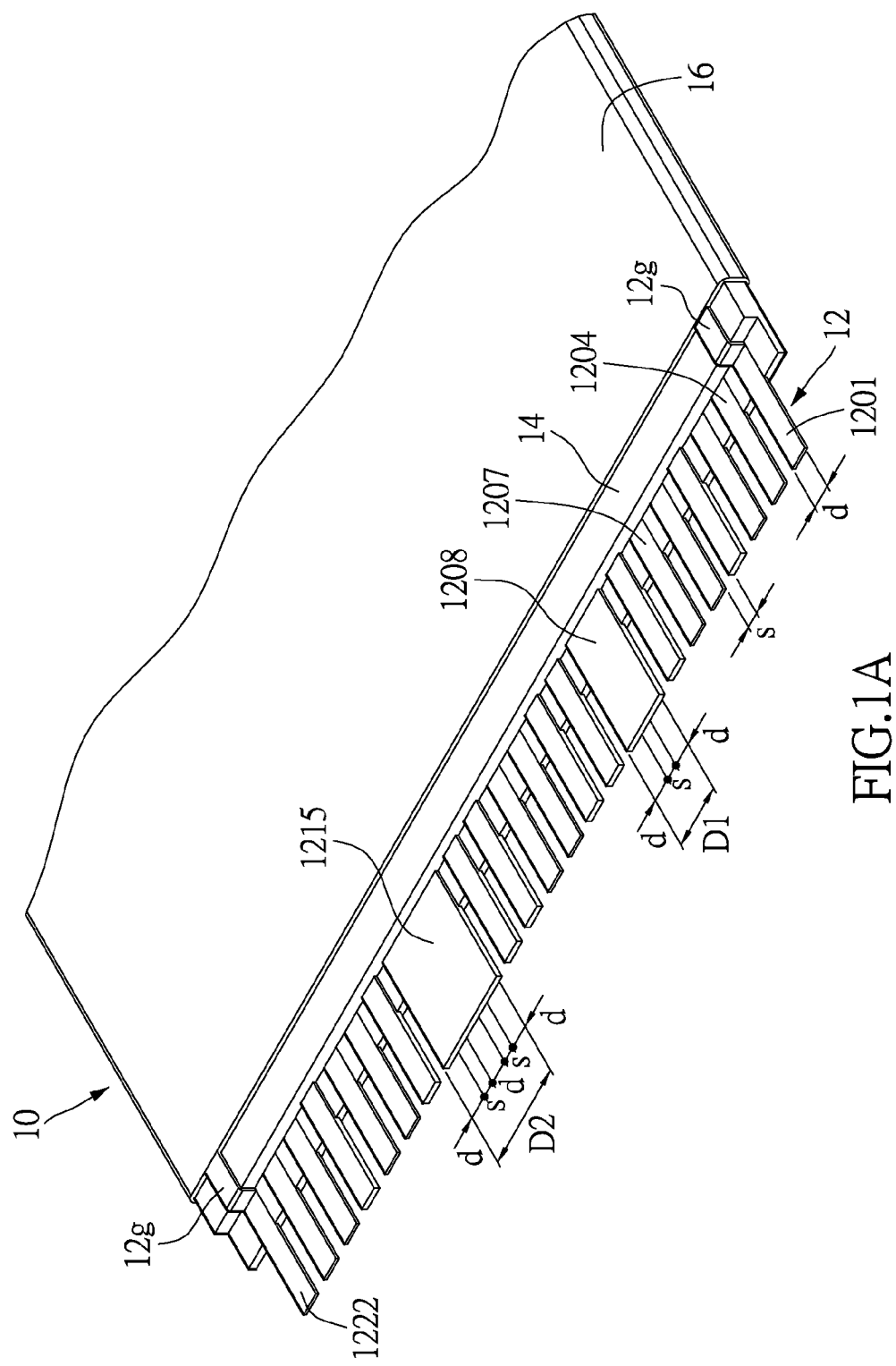
FIG. 1A is a partial enlarged view of a flat flexible cable of the present disclosure.
Figure 1B:
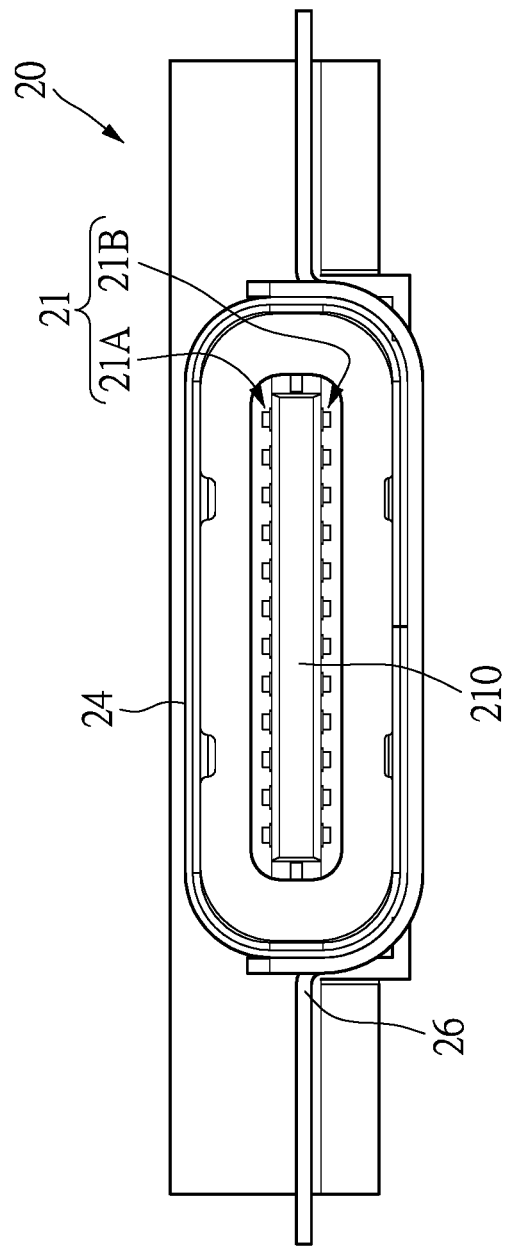
FIG. 1B is a side view of the assembly of cable and connector of the present disclosure.

Please refer to FIG. 1B, the input-output connector 20 has a shielding housing 24, a retaining frame 26, and a plurality of terminals 21 disposed in the shielding housing 24 extending inward and rearward. The retaining frame 26 is connected to a periphery of the shielding housing 24 for fixing the input-output connector 20 to an electronic device. In this embodiment, to take a USB Type-C connector as an example of the input-output connector 20, complies with a standard specification of USB 3.1 preferably. The shielding housing 24 has a tongue board 210 arranged therein, and the terminals 21 are disposed on a surface of the tongue board 210 and extended to a rear end of the input-output connector 20. The terminals 21 include a plurality of upper-side terminals 21A and a plurality of lower-side terminals 21B which are distributed on two surfaces of the tongue board 210 respectively. In this embodiment, the input-output connector 20 has twenty-four pieces of terminals 21 in total, which are divided as twelve upper-side terminals 21A of and twelve lower-side terminals 21B. According to a power transmitting specification, a standard transmitting capacity of electric current of the cable and the connector is 5 ampere (A). The highest transmitting speed is 10 G bit/sec (Gbps). The present disclosure provides a newly-designed flat flexible cable for adapting to a USB Type-C connector, which can fulfill with high-frequency and high-current transmitting functions with a lower manufacturing cost.

Please refer to FIG. 1 and FIG. 2, the paddle card 30 has a base board 32, and a plurality of transferring circuits 34 distributed on the base board 32. The transferring circuits 34 have a plurality of first pads 34a distributed at one side of the base board 32, and a plurality of second pads 34b distributed at another side of the base board 32. The first pads 34a are correspondingly connected to the conductor wires 12 of the flat flexible cable 10. The second pads 34b are correspondingly connected to the terminals 21 of the input-output connector 20.

Figure 4:
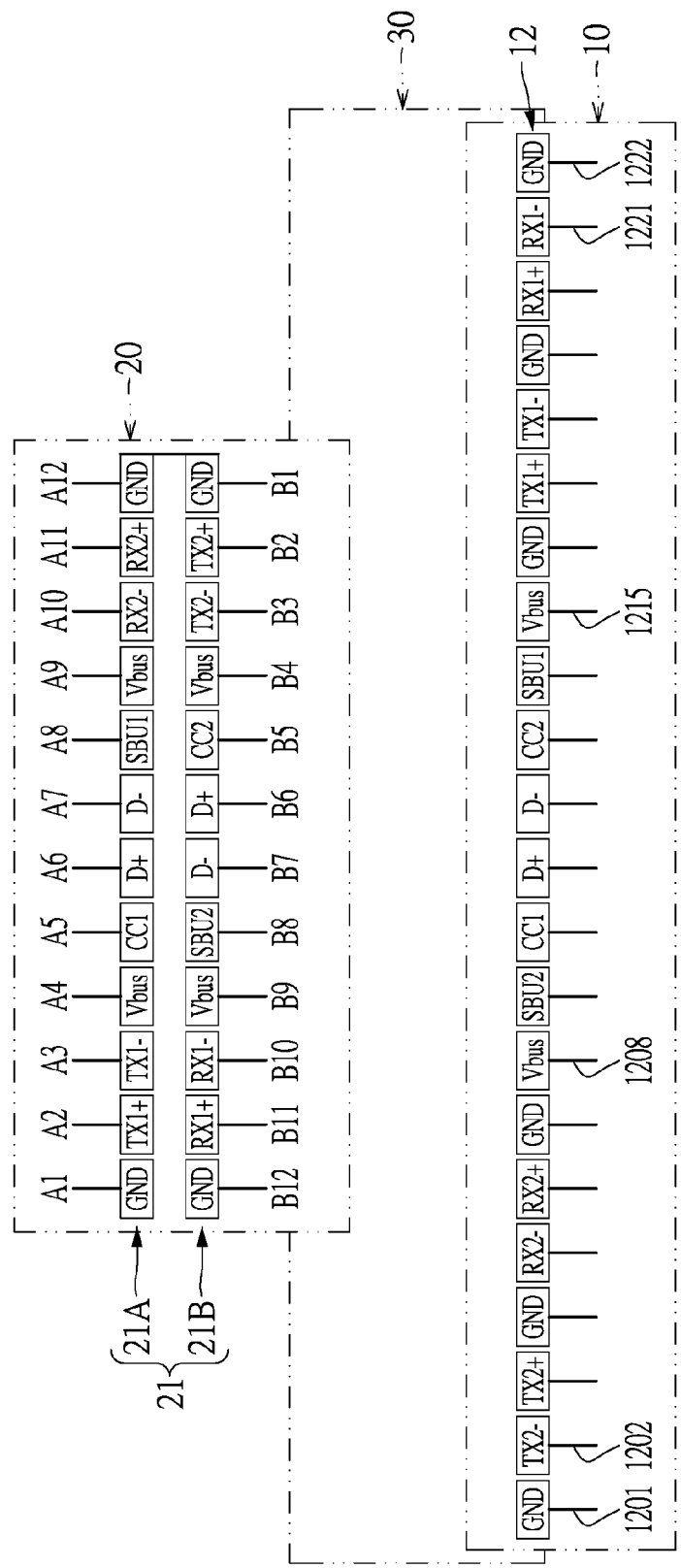
FIG. 4 is a pinout diagram of the assembly of cable and connector of the present disclosure.

As shown in FIG. 1A and FIG. 4, the conductor wires 12 includes at least one first integrated power wire 1208, a plurality of ground wires (such as labelled numbers of 1201, 1204, 1207, 1222) and a plurality of signal wires (such as labelled numbers of 1202, 1221). One characteristic of the present disclosure is that, a width of the first integrated power wire 1208 is larger than two times a width of one of the signal wires (such as labelled number of Transmitter differential pair (TX2−, TX2+) 1202, 1203, and Receiver differential pair (RX2−, RX2+) 1205, 1206).

According to its specification, a conductor wire in a conventional flat flexible cable is able to transmit an electric current about 0.8 ampere. For a condition to fulfill a transmitting standard of 5 amperes of USB Type-C connector, the conventional flat flexible cable needs more than seven pieces of conventional conductor wires to proportion the electric current of 5 amperes. Such a condition causes too many pieces of the conductor wire in the conventional flat flexible cable, and a total width of the flat flexible cable is too wide. However, by the above arrangement of the present disclosure, one of the first integrated power wire 1208 can transmit over two times of 0.8 amperes. Therefore, the present disclosure has the advantage that a number of the terminals 21 is more than a number of the conductor wires 12. More specifically, in this embodiment, the number of conductor wires 12 of the flat flexible cable 10 is twenty-two, which is less than twenty-four, the number of the terminals 21 of the input-output connector 20.

Please refer to FIG. 1 and FIG. 2. The paddle card 30 has a specific configuration corresponding to the above arrangement. A number of the first pads 34a of the paddle card 30 is less than a number of the second pads 34b. A number of the first pads 34a is equal to a number of the conductor wires 12. A number of the second pads 34b is equal to a number of the terminals 21, and a number of the conductor wires 12 is less than a number of the terminals 21. The first pads 34a includes at least one integrated power pad (such as 342, 343) and at least one signal pad 341. A width of the integrated power pads 342, 343 is larger than a width of the signal pad 341. The integrated power pad 342 is correspondingly connected to the first integrated power wire 1208.

More specifically, the width of the first integrated power wire 1208 can be deemed as a total width of the neighboring two of the conductor wires 12. An interval (s) is formed between two neighbors of the signal wire (such as labelled number of 1202). A width D1 of the first integrated power wire 1208 is equal to two times the width (d) of the signal wire (such as labelled number of 1202) and one of the interval (s). Preferably, all the signal wires of the present disclosure could have identical width (d), and identical interval (s), but it is not limited thereto. Thus, the present disclosure compares the same thickness with the conductor wire of the conventional flat flexible cable, and the first integrated power wire 1208 can transmit 2 to 2.25 amperes. In addition, as shown in FIG. 1A, the present disclosure even can make the thickness of the first integrated power wire 1208 thicker than the thickness of the signal wire (such as that labelled number 1202), so as to transmit an electric current larger than 2.25 amperes.

Please refer to FIG. 1A. The flat flexible cable 10 further has a shielding layer 16 wrapped around the insulated layer 14. The conductor wires 12 include at least one ground wire (such as 1201, 1222), and a transferring conductor 12g. The transferring conductor 12g is used to connect the at least one ground wire (1201, 1222) with the shielding layer 16.

Please refer to FIG. 1A. In this embodiment, the conductor wire 12 includes a second integrated power wire 1215. A width D2 of the second integrated power wire 1215 is larger than a width D1 of the first integrated power wire 1208. And, the width D2 of the second integrated power wire 1215 is equal to three times width (d) of the signal wire (such as that labelled number 1202) plus two times of the interval (s). The integrated power pad 342 is connected to the first integrated power wire 1208, correspondingly.

Figure 3A:
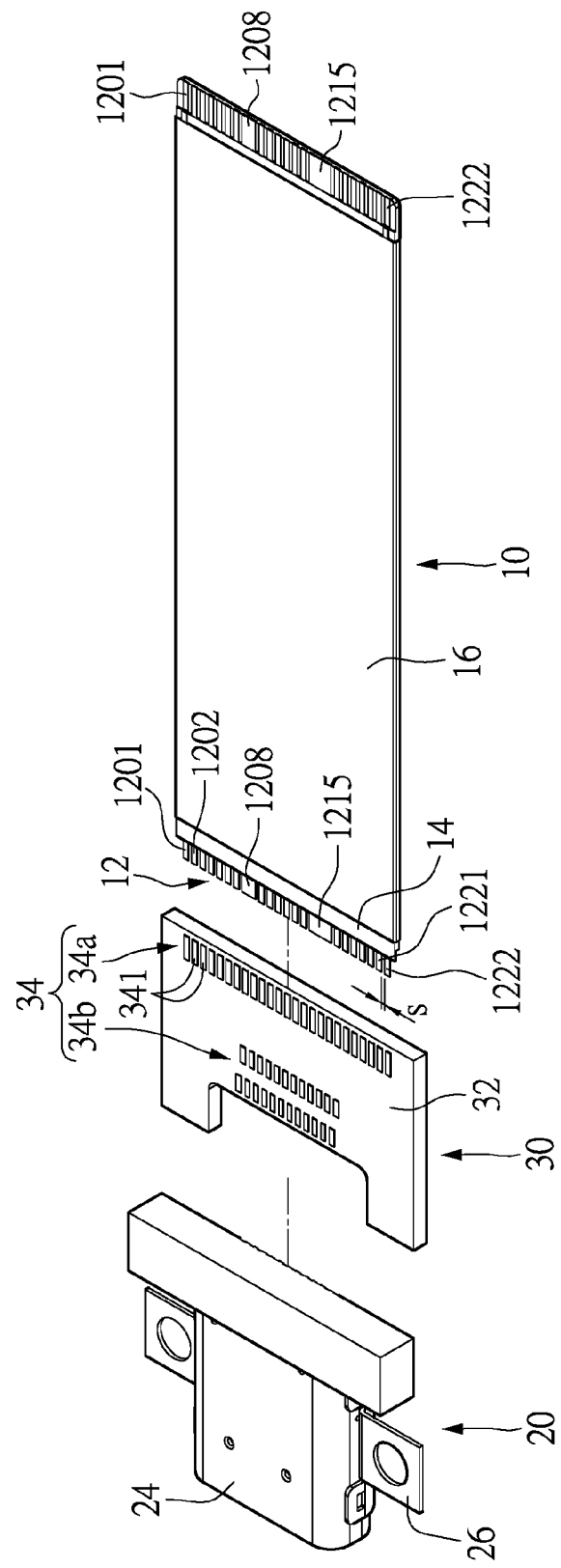
FIG. 3A is an exploded perspective view of the assembly of cable and connector with another paddle card according to the present disclosure.

Please refer to FIG. 3A, which is an exploded perspective view of the assembly of cable and connector with another paddle card according to the present disclosure. This embodiment differs from the embodiment of FIG. 1 on the paddle card 30. All the first pads 34a of the paddle card 30 have identical width, and an identical interval therebetween. In other words, the first integrated power wire 1208 is correspondingly soldered to two first pads 34a, and the second integrated power wire 1215 is correspondingly soldered to three first pads 34a. Namely, there are a total of 25 pieces of first pads 34a. In such a configuration, the other end of the flat flexible cable 10 can be connected to a circuit board by an electrical connector. The advantage of this embodiment is that, heat can be conducted evenly on the paddle card 30 during a heating and soldering process. From another view, in such an arrangement as this embodiment, the number (25 pieces) of the first pads 34a of the paddle card 30 is more than the number (24 pieces) of the second pads 34*b*, and also more than the number (24 pieces) of the terminals 21 of the input-output connector 20. The number (24 pieces) of the second pads 34*b* is more than the number (22 pieces) of the conductor wires 12 of the flat flexible cable 10.

Please refer to FIG. 4, which is a pinout diagram of the assembly of cable and connector of the present disclosure. The number of the terminals 21 is 24 pieces. In the present disclosure, the number of the conductor wires 12 of the flat flexible cable 10 is 22 pieces, this is still less than the number of the terminals 21 of the input-output connector 20.

Figure 5:
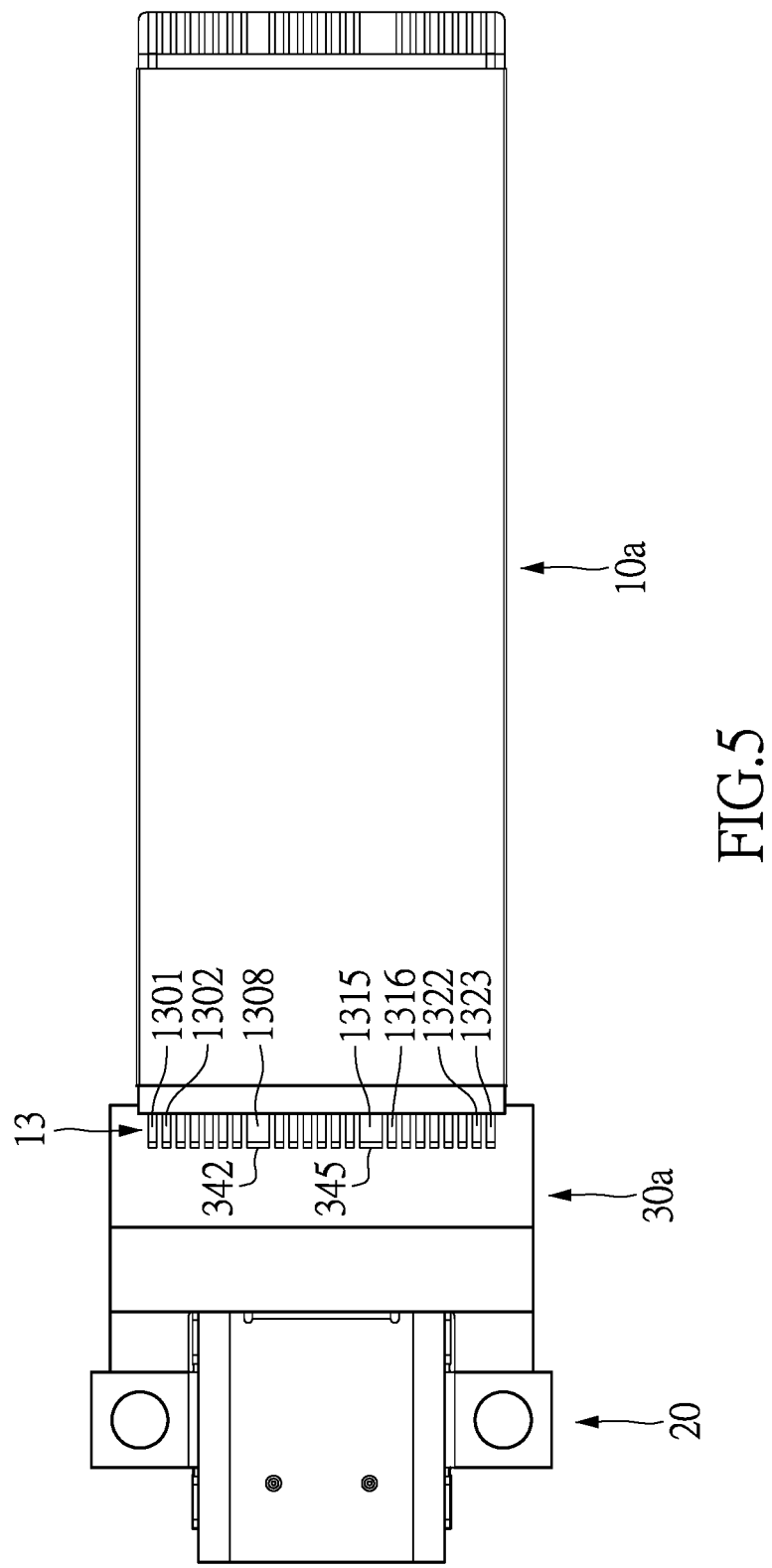
FIG. 5 is a top view of the assembly of cable and connector of another embodiment of the present disclosure.
Figure 5A:
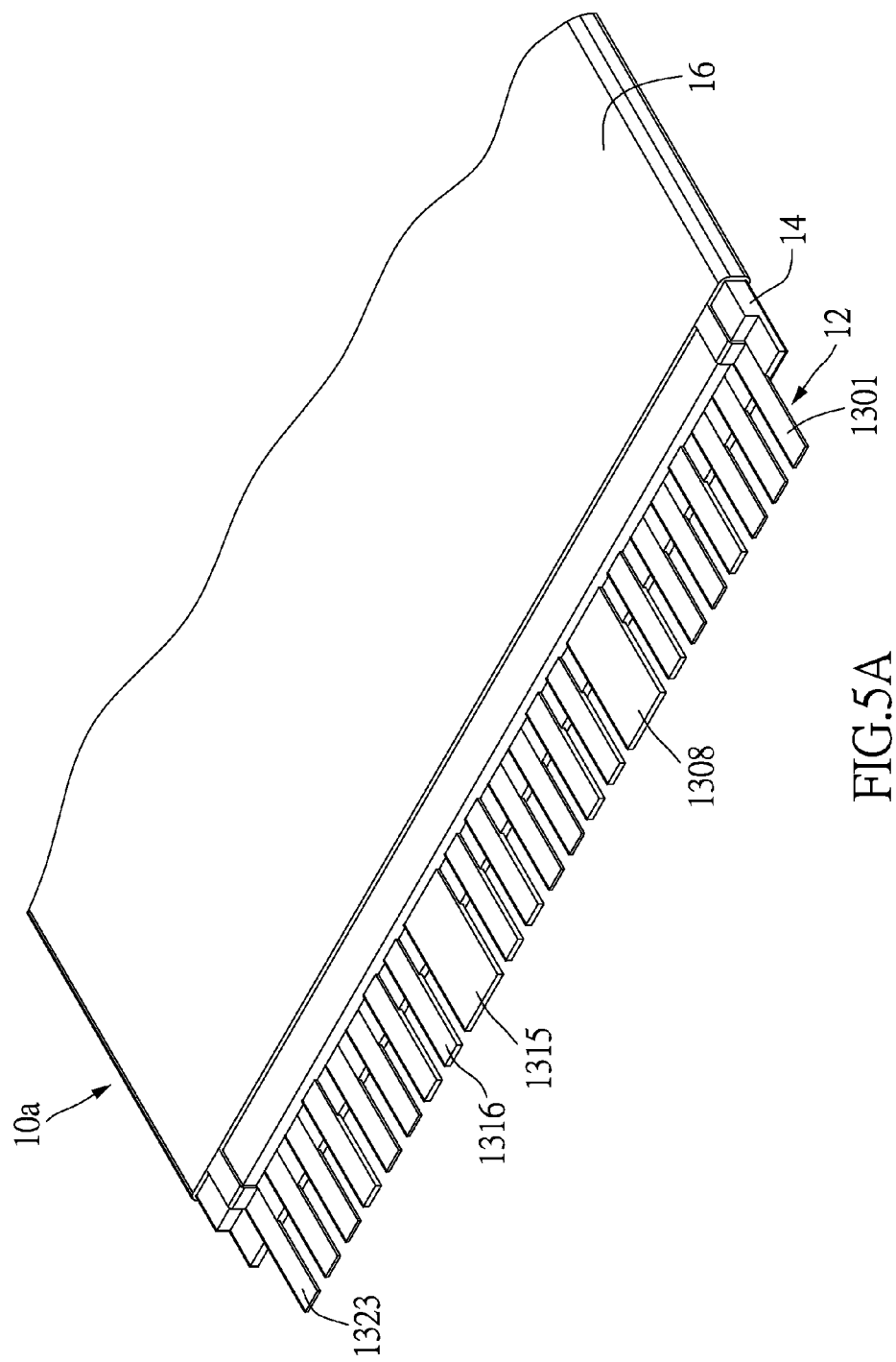
FIG. 5A is a partial enlarged view of the flat flexible cable of another embodiment of the present disclosure.

Please refer to FIG. 5 and FIG. 5A. FIG. 5 is a top view of the assembly of a cable and connector having a flat flexible cable of another embodiment of the present disclosure. FIG. 5A is a partial enlarged view of the flat flexible cable of another embodiment of the present disclosure. Different from the above embodiments, in this embodiment, the conductor wires 13 of the flat flexible cable 10*a* further have at least one first integrated power wire 1308, and a non-integrated power wire 1316 at one side of the first integrated power wire 1308. This embodiment has two of the first integrated power wires 1308, 1315. A width of the non-integrated power wire 1316 is the same as the signal wires 1302, 1322 (or the ground wire 1301, 1323).

To match with two first integrated power wires 1308, 1315, the paddle card 30*a* has two integrated power pads 342, 345 with the same width, which is larger than the width of the signal pad.

Figure 6:
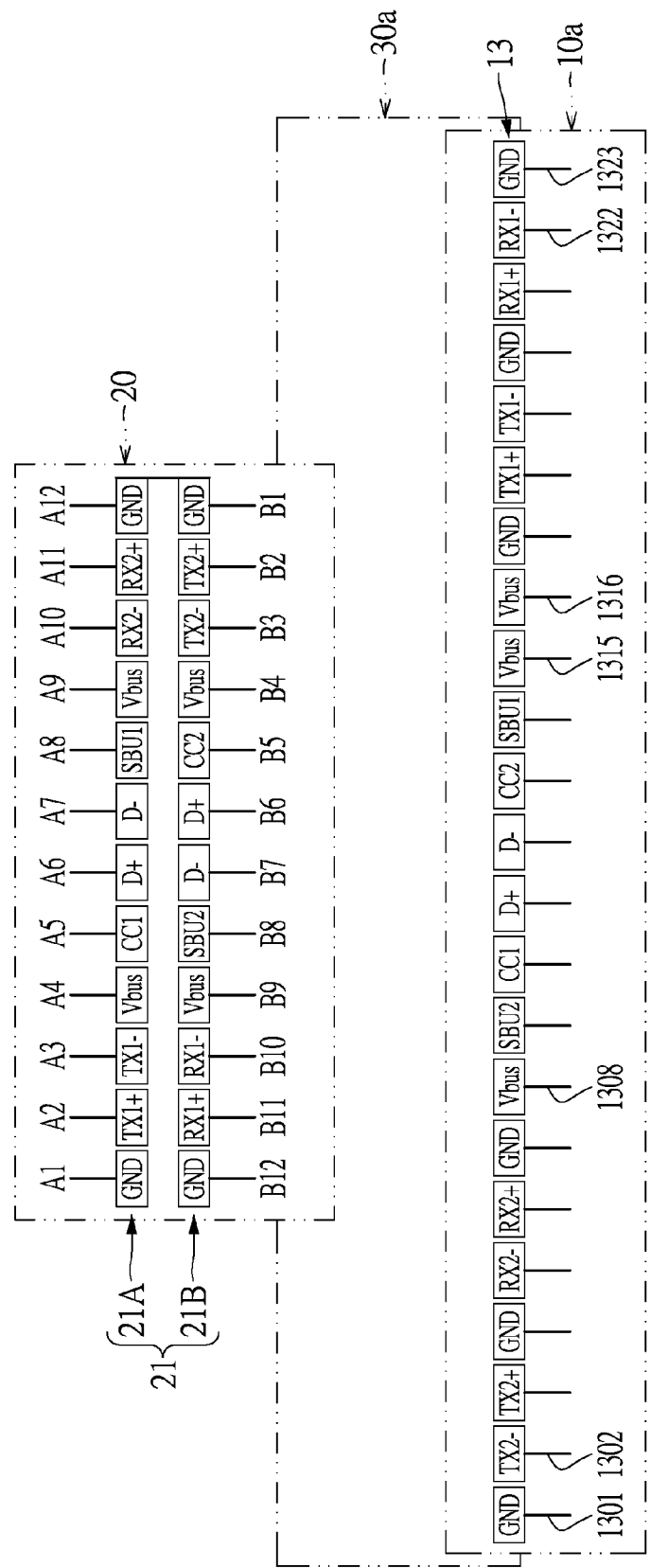
FIG. 6 is another pinout diagram of the assembly of cable and connector of the present disclosure.

As shown in FIG. 6, which is another pinout diagram of the assembly of cable and connector of the present disclosure. According to this arrangement, the flat flexible cable 10*a* has 23 pieces of the conductor wire 13, the total number is still less than the terminals of the input-output connector 20 (24 piece).

To arrange the electric current to turn back the ground wire, this embodiment can have several ground wires, adding thickness. Namely, the thickness of the ground wire is thicker than that of the signal wire, so as to load the same high current.

The present disclosure has advantages and functions as follows. The present disclosure can achieve the transmitting requirements of high-frequency and high-current by a flat flexible cable, and fulfill the transmitting function of high-frequency and high-current with a lower manufacturing cost. In addition, the number of the power conductor wire is less, yet it can achieve the transmitting requirement of high current and reduce the total width of the flat flexible cable.

The arrangement of the present disclosure can avoid a difficult wiring of general cable in an electronic device. Compared with a traditional flat flexible cable, the width of the present disclosure is reduced. In addition, the general input/output applied in an electronic device usually needs a paddle card, a cable connector disposed on the paddle card, and another cable connector connected to a flat flexible cable, however such arrangement could not fulfill the high-requirements.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. An assembly of cable and connector, comprising:
   a flat flexible cable, having a plurality of conductor wires arranged parallel to each other, an insulated layer wrapped around the conductor wires, wherein the conductor wires include at least one first integrated power wire and a plurality of signal wires, a width of each of the at least one first integrated power wire being larger than two times a width of one of the signal wires;
   an input-output connector, having a plurality of terminals, the terminals including a plurality of upper-side terminals and a plurality of lower-side terminals, wherein a number of the terminals of the input-output connector is more than a number of the conductor wires of the flat flexible cable; and
   a paddle card, having a base board, and a plurality of transferring circuits distributed on the base board, the plurality of transferring circuits including a plurality of first pads distributed on one side of the base board, and a plurality of second pads distributed on another side of the base board, the first pads being connected to the conductor wires of the flat flexible cable correspondingly; the second pads being connected to the terminals of the input-output connector correspondingly; wherein all the first pads of the paddle card have an identical interval therebetween;
   wherein an interval is formed between two neighboring signal wires, and a width of the first integrated power wire being equal to two times a width of the signal wire and one of the interval, wherein all wires have the identical interval.

2. The assembly of cable and connector of claim 1, wherein the conductor wires further include a non-integrated power wire disposed at one side of the first integrated power wire.

3. The assembly of cable and connector of claim 1, wherein the conductor wires include a second integrated power wire, a width of the second integrated power wire is larger than a width of the first integrated power wire.

4. The assembly of cable and connector of claim 3, wherein a neighboring two of the signal wires has an interval, wherein a width of the second integrated power wire is equal three times a width of one of the signal wires and two times a width of the interval, and the second integrated power wire is correspondingly soldered to three of the first pads.

5. The assembly of cable and connector of claim 1, wherein a thickness of the first integrated power wire is larger than a thickness of the signal wire.

6. The assembly of cable and connector of claim 1, wherein a number of the first pads is equal to a number of the conductor wires, a number of the second pads is equal to a number of the terminals, a number of the conductor wires is smaller than a number of the terminals.

7. The assembly of cable and connector of claim 1, wherein the first pads include at least one integrated power pad and at least one signal pad, a width of the integrated power pad is larger than a width of the signal pad, the at least one integrated power pad is correspondingly connected to the first integrated power wire.

8. The assembly of cable and connector of claim 1, wherein the flat flexible cable further includes a shielding layer covered on a periphery of the insulated layer.

9. The assembly of cable and connector of claim 8, wherein the conductor wires include at least one ground wire, and a transferring conductor, the transferring conductor connects the at least one ground wire to the shielding layer.

10. The assembly of cable and connector of claim 3, wherein the input-output connector is complied with a USB Type-C specification, and a predetermined number of the terminals which are designated to transmit power connect to the at least one first integrated power wire, thereby the at least one first integrated power wire is able to transmit a current over two times each of the terminals which are designated to transmit power.

11. The assembly of cable and connector of claim 1, wherein all the first pads of the paddle card have identical width, and the first integrated power wire is correspondingly soldered to two of the first pads.

12. The assembly of cable and connector of claim 1, wherein a number of the first pads of the paddle card is less than a number of the second pads, and a number of the first pads is equal to a number of the conductor wires; wherein a number of the second pads is equal to a number of the terminals, and a number of the conductor wires is less than a number of the terminals.

13. The assembly of cable and connector of claim 12, wherein the first pads includes at least one integrated power pad and at least one signal pad, and a width of the integrated power pads is larger than a width of the signal pad, and the integrated power pad is correspondingly connected to the first integrated power wire.

\* \* \* \* \*